United States Patent
Gehrke et al.

(10) Patent No.: US 8,816,373 B2
(45) Date of Patent: Aug. 26, 2014

(54) OPTOELECTRONIC SEMICONDUCTOR CHIP AND METHOD FOR PRODUCING AN OPTOELECTRONIC SEMICONDUCTOR CHIP

(71) Applicant: OSRAM Opto Semiconductors GmbH, Regensburg (DE)

(72) Inventors: Kai Gehrke, Regensburg (DE); Korbinian Perzlmaier, Regensburg (DE); Richard Floeter, Tegernheim (DE); Christian Schmid, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 13/632,846

(22) Filed: Oct. 1, 2012

(65) Prior Publication Data

US 2013/0175564 A1 Jul. 11, 2013

Related U.S. Application Data

(60) Provisional application No. 61/540,712, filed on Sep. 29, 2011, provisional application No. 61/576,749, filed on Dec. 16, 2011.

(30) Foreign Application Priority Data

Sep. 29, 2011 (DE) .......................... 10 2011 115 299

(51) Int. Cl.
*H01L 33/46* (2010.01)

(52) U.S. Cl.
USPC 257/98; 257/99; 257/E33.072; 257/E33.068; 438/29

(58) Field of Classification Search
USPC ........ 257/79–100, E33.055–E33.074; 438/29
See application file for complete search history.

(56) References Cited

U.S. PATENT DOCUMENTS

| | | | |
|---|---|---|---|
| 7,355,209 B2 * | 4/2008 | Tsai et al. ........................ | 257/79 |
| 7,646,036 B2 * | 1/2010 | Kozawa et al. ................. | 257/99 |
| 2006/0186417 A1 | 8/2006 | Tsai et al. | |
| 2008/0185609 A1 | 8/2008 | Kozawa et al. | |
| 2009/0134418 A1 | 5/2009 | Lee | |
| 2009/0278150 A1 | 11/2009 | Lee et al. | |
| 2010/0171135 A1 | 7/2010 | Engl et al. | |
| 2011/0049541 A1 | 3/2011 | Katsuno et al. | |

FOREIGN PATENT DOCUMENTS

WO WO 2007/120016 10/2007

* cited by examiner

*Primary Examiner* — Matthew W Such
*Assistant Examiner* — Scott Stowe
(74) *Attorney, Agent, or Firm* — Cozen O'Connor

(57) ABSTRACT

In at least one embodiment, the optoelectronic semiconductor chip comprises a semiconductor layer sequence for generating an electromagnetic radiation, and also a silver mirror. The silver mirror is arranged at the semiconductor layer sequence. Oxygen is admixed with the silver of the silver mirror. A proportion by weight of the oxygen in the silver mirror is preferably at least $10^{-5}$ and furthermore preferably at most 10%.

14 Claims, 2 Drawing Sheets

OPTOELECTRONIC SEMICONDUCTOR CHIP AND METHOD FOR PRODUCING AN OPTOELECTRONIC SEMICONDUCTOR CHIP

RELATED APPLICATIONS

This application claims the priority of German Application No. 10 2011 115 299.0 filed Sep. 29, 2011, U.S. Provisional Application No. 61/540,712 filed Sep. 29, 2011 and US Provisional application No. 61/576,749 filed Dec. 16, 2011, the entire content of all of which are hereby incorporated by reference.

FIELD OF THE INVENTION

An optoelectronic semiconductor chip is specified. Furthermore, a method for producing such an optoelectronic semiconductor chip is specified.

SUMMARY OF THE INVENTION

An object to be achieved is to provide an optoelectronic semiconductor chip which emits radiation particularly energy-efficiently.

In accordance with at least one embodiment of the optoelectronic semiconductor chip, the latter comprises a semiconductor layer sequence. The semiconductor layer sequence of the semiconductor chip is preferably based on a III-V compound semiconductor material. The semiconductor material is preferably a nitride compound semiconductor material such as $Al_nIn_{1-n-m}Ga_mN$ or else a phosphide compound semiconductor material such as $Al_nIn_{1-n-m}Ga_mP$, wherein in each case $0 \leq n \leq 1$, $0 \leq m \leq 1$ and $n+m \leq 1$. The semiconductor material can likewise be $Al_xGa_{1-x}As$ where $0 \leq x \leq 1$. In this case, the semiconductor layer sequence can comprise dopants and additional constituents. For the sake of simplicity, however, only the essential constituents of the crystal lattice of the semiconductor layer sequence, that is to say Al, As, Ga, In, N or P, are specified, even if these can be replaced and/or supplemented in part by small amounts of further substances.

The semiconductor layer sequence comprises an active layer having at least one pn junction and/or having one or having a plurality of quantum well structures. During the operation of the semiconductor chip, an electromagnetic radiation is generated in the active layer. A wavelength of the radiation is preferably in the ultraviolet and/or visible spectral range, in particular at wavelengths of between 420 nm and 680 nm inclusive, for example between 440 nm and 480 nm inclusive.

In accordance with at least one embodiment, the semiconductor chip is a light emitting diode, LED for short. The semiconductor chip is then preferably designed to emit blue light or white light.

In accordance with at least one embodiment, the semiconductor chip comprises a silver mirror. The silver mirror is arranged at the semiconductor layer sequence and designed to reflect the radiation generated in the active layer, in particular in a direction toward a radiation exit area of the semiconductor chip. The silver mirror preferably reflects specularly. In other words, the silver mirror is then not a diffusely reflective mirror.

In accordance with at least one embodiment of the semiconductor chip, oxygen is admixed with the silver mirror. In other words, the silver mirror then also comprises, besides silver, Ag for short, oxygen, O for short, as an essential material component.

In accordance with at least one embodiment of the optoelectronic semiconductor chip, a proportion by weight of the oxygen in the silver mirror is at least $10^{-6}$ or at least $10^{-5}$ or at least $10^{-4}$ or at least 0.1% or at least 1%. Alternatively or additionally, the proportion by weight of the oxygen is at most 10% or at most 1% or at most 0.1% or at most $10^{-4}$ or at most $10^{-5}$. In other words, no or substantially no pure silver oxide is then present in the silver mirror, rather it is possible for the oxygen to be regarded as a type of doping of the silver of the silver mirror.

According to at least one embodiment, the optoelectronic semiconductor chip comprises a semiconductor layer sequence for generating an electromagnetic radiation, and a silver layer. The silver mirror is arranged at the semiconductor layer sequence. Oxygen is admixed with the silver of the silver mirror. A proportion by weight of the oxygen in the silver mirror is preferably at least $10^{-5}$ and furthermore preferably at most 10%.

An optoelectronic semiconductor chip that emits radiation particularly efficiently can be realized by virtue of such a silver mirror. The use of such a silver mirror for the semiconductor chip is based, inter alia, on the following insight:

In order to make electrical contact with an optoelectronic semiconductor chip such as a light emitting diode, in particular at a p-side, a metallic or metal-containing material is to be applied to a semiconductor material. In this case, a contact resistance arises between the metal and the semiconductor material. Said contact resistance forms a series resistance with the actual light-generating active layer. In order to be able to operate the semiconductor chip efficiently, a contact resistance that is as low as possible is required.

In order to reduce the contact resistance it is possible to fit an intermediate layer between a mirror and the semiconductor layer sequence. By way of example, the intermediate layer is formed by a thin layer of platinum or nickel, wherein a thickness of said intermediate layer is typically less than 1 nm or less than 5 nm. However, in comparison with silver, such materials such as platinum or nickel have a lower reflectivity, in particular in the blue spectral range. Consequently, by using such materials, although the contact resistance can be reduced, a reflectivity of the mirror decreases.

A reduction of the contact resistance is likewise obtained by introducing a comparatively small amount of oxygen in the silver mirror. On the other hand, the reflectivity of the silver mirror is not or not significantly reduced by the introduction of the oxygen. Consequently, a semiconductor chip that emits radiation particularly energy-efficiently can be achieved by means of a silver mirror containing comparatively small amounts of oxygen. On account of the brown coloration of silver oxide and the relatively low reflectivity to visible radiation at silver oxide, the oxygen content is intended, however, not to be dimensioned as excessively high.

In accordance with at least one embodiment of the semiconductor chip, the silver mirror is applied in places or over the whole area directly at the semiconductor layer sequence having the active layer. In other words, a material of the silver mirror is then in direct physical contact with a semiconductor material of the semiconductor layer sequence at least in places.

In accordance with at least one embodiment of the semiconductor chip the silver mirror exclusively consists of the substances silver and oxygen. The fact that the silver mirror consists of silver and oxygen means, in particular, that impurities resulting from other substances are at most 100 ppm or at most 10 ppm. In this case, ppm stands for parts per million, relative to the weight or to the number of atoms.

In accordance with at least one embodiment of the semiconductor chip, a covering layer is fitted to a side of the silver mirror which faces away from the semiconductor layer sequence. The covering layer is preferably in direct physical contact with the silver mirror at least in places and is designed to be oxygen-permeable.

In accordance with at least one embodiment of the semiconductor chip, the covering layer comprises a metal oxide or consists of one or more metal oxides. In particular, the covering layer is produced from a transparent conductive metal oxide, TCO for short. Dopants can be admixed with the metal oxide of the covering layer in order to set an electrical conductivity.

In accordance with at least one embodiment of the semiconductor chip, the covering layer is formed by zinc oxide, ZnO for short, or by doped zinc oxide such as ZnO:Ga or ZnO:Si.

In accordance with at least one embodiment of the semiconductor chip, a thickness of the covering layer is at least 10 nm or at least 20 nm or at least 35 nm. Alternatively or additionally, the thickness of the covering layer is at most 1 µm or at most 500 nm or at most 150 nm or at most 100 nm or at most 80 nm. An oxygen permeability of the covering layer can be obtained by means of such thicknesses. In other words, oxygen can then pass through the covering layer by means of thermally induced diffusion.

In accordance with at least one embodiment of the semiconductor chip, the semiconductor layer sequence comprises a partial layer. The partial layer preferably directly adjoins the silver mirror. The partial layer is preferably p-doped and based on GaN, on AlInGaN or on AlGaN.

In accordance with at least one embodiment of the semiconductor chip, a thickness of the partial layer is at least 2 nm or at least 5 nm. Alternatively or additionally the partial layer has a thickness of at most 250 nm, or at most 50 nm or at most 20 nm. In particular, the thickness of the partial layer is approximately 10 nm.

In accordance with at least one embodiment of the semiconductor chip, the partial layer is doped with magnesium or with some other p-type dopant. A dopant concentration in the partial layer is preferably at least $1 \times 10^{-19}$ cm$^{-3}$ or at least $5 \times 10^{-19}$ cm$^{-3}$. Alternatively or additionally, the dopant concentration is at most $2 \times 10^{20}$ cm$^{-3}$ or at most $1.5 \times 10^{20}$ cm$^{-3}$. In other words, the partial layer is preferably a thin, highly p-doped GaN layer.

In accordance with at least one embodiment of the semiconductor chip, a boundary layer is situated between the silver mirror and the semiconductor layer sequence. The boundary layer can be formed by a mixture of the materials from the silver mirror, that is to say silver and oxygen, and the materials of the semiconductor layer sequence, that is to say in particular gallium, nitrogen, aluminum, indium and/or magnesium. In other words, the boundary layer is a transition layer from a material composition of the semiconductor layer sequence toward a material composition of the silver mirror. A thickness of the boundary layer is preferably at most 5 nm or at most 1.0 nm or at most 0.5 nm or at most 0.25 nm.

In accordance with at least one embodiment of the semiconductor chip, an oxygen concentration in the partial layer of the semiconductor layer sequence and/or in the boundary layer is at most $1 \times 10^{15}$ cm$^{-3}$ or at most $1 \times 10^{16}$ cm$^{-3}$ or at most $1 \times 10^{17}$ cm$^{-3}$. In other words, the partial layer and/or the boundary layer are/is then not doped with oxygen in a targeted manner.

In accordance with at least one embodiment of the semiconductor chip, the thickness of the silver mirror is at least 50 nm or at least 70 nm or at least 90 nm or at least 110 nm. Alternatively or additionally the thickness of the silver mirror is at most 5 µm or at most 1.1 µm or at most 300 nm. By means of such thicknesses of the silver mirror, on the one hand, a sufficiently high reflectivity of the silver mirror can be obtained since no radiation generated in the semiconductor layer sequence can penetrate or pass through the silver mirror. On the other hand, in the case of such thicknesses, oxygen can penetrate through the silver mirror and pass toward the boundary layer and/or the partial layer and/or the semiconductor layer sequence.

In accordance with at least one embodiment of the semiconductor chip, the oxygen concentration present in the boundary layer is higher than that in the partial layer and/or in remaining parts of the semiconductor layer sequence. Furthermore, it is possible for the proportion of oxygen in the boundary layer to be greater than or equal to the proportion of oxygen in the silver mirror. By way of example, the boundary layer comprises an Ag$_2$O layer or an AgO$_x$ layer or consists thereof, in particular directly at the semiconductor layer sequence. Therefore, an Ag$_2$O layer or an AgO$_x$ layer can be formed directly at the semiconductor layer sequence of the whole area or in places.

Furthermore, a method for producing an optoelectronic semiconductor chip is specified. In particular, a semiconductor chip as described in one or more of the embodiments mentioned above can be produced by the method. Therefore, features of the optoelectronic semiconductor chip are also disclosed for the method described here, and vice versa.

According to at least one embodiment of the method, the latter comprises at least the following steps, preferably in the stated order:

providing a semiconductor layer sequence having an active layer provided for generating radiation, applying a silver mirror to the semiconductor layer sequence, admixing oxygen with the silver of the silver mirror, wherein a proportion by weight of the admixed oxygen, relative to the silver of the silver mirror, is preferably between $10^{-5}$ and 10% inclusive, and completing the semiconductor chip.

In accordance with at least one embodiment of the method, the silver mirror is subjected to heat treatment in an oxygen-containing atmosphere.

In accordance with at least one embodiment of the method, the covering layer is exposed during the admixing of the oxygen in the silver mirror. In other words, the oxygen then passes in the silver mirror through the covering layer, in particular from an oxygen-containing atmosphere.

In accordance with at least one embodiment of the method, wherein a covering layer is applied on the silver mirror, during the admixing of the oxygen a method temperature is between 100° C. and 500° C. inclusive, in particular between 300° C. and 500° C. inclusive, or between 350° C. and 450° C. inclusive.

In accordance with at least one embodiment of the method, the admixing of the oxygen is effected under an atmosphere having an oxygen partial pressure of at least 2 mbar or of at least 20 mbar or of at least 100 mbar. Alternatively or additionally, the oxygen partial pressure is at most 500 mbar or at most 300 mbar or at most 200 mbar or at most 100 mbar or at most 50 mbar.

In accordance with at least one embodiment of the method, wherein the admixing of the oxygen is effected at temperatures distinctly above room temperature, a time duration of the admixing of the oxygen is at least 10 s or at least 30 s or at least 2 min or at least 5 min or at least 10 min. Alternatively or additionally, this time period for admixing the oxygen is at most 1 hour or at most 40 min or at most 30 min. The oxygen can be admixed, in particular, in the form of a short flash, as it is called.

In accordance with at least one embodiment of the method, the silver mirror is exposed during the admixing of the oxygen. In other words, an interface of the silver mirror that faces away from the semiconductor layer sequence is then subjected to an oxygen-containing atmosphere.

In accordance with at least one embodiment of the method, wherein the silver mirror is free of a covering layer, the admixing of the oxygen is effected at a temperature of at least 0° C. or of at least 10° C. or of at least 18° C. Alternatively or additionally, the temperature during the admixing of the oxygen is then preferably at most 50° C. or at most 80° C. or at most 130° C.

In accordance with at least one embodiment of the method, wherein the silver mirror is free of a covering layer, a duration of the admixing of the oxygen is at least 15 hours or at least 10 hours or at least 5 hours or at least 2 hours. It is possible for said duration to be at most 48 hours or at most 36 hours or at most 24 hours.

BRIEF DESCRIPTION OF THE DRAWINGS

An optoelectronic semiconductor chip described here and a method described here are explained in greater detail below on the basis of exemplary embodiments with reference to the drawing. In this case, identical reference signs indicate identical elements in the individual figures. In this case, however, relations to scale are not illustrated; moreover, individual elements may be illustrated with an exaggerated size in order to afford a better understanding.

In the figures.

DETAILED DESCRIPTION OF THE DRAWINGS

Figure 1A:
FIGS. 1A, 1B, 1C and 1D show schematic illustrations of sequential steps of a method for producing an optoelectronic semiconductor chip in accordance with an embodiment of the invention.

In accordance with FIG. 1A, a semiconductor layer sequence 2 having an active layer for generating an electromagnetic radiation is provided. The semiconductor layer sequence 2 is based on AlInGaN. On a main side 25, oriented perpendicularly to a growth direction G of the semiconductor layer sequence 2, the silver layer 3 is applied directly.

The silver mirror is applied, for example, by means of vapor deposition or by means of sputtering. The material of the silver mirror 3 is preferably pure silver. Impurities in the material for the silver mirror 3 preferably make up at most 100 ppm. A thickness of the silver mirror 3 along the growth direction G is approximately 140 nm, for example.

Figure 1B:
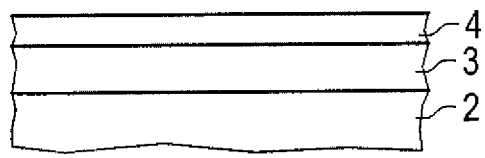

In accordance with FIG. 1B, a covering layer 4 is applied directly to the silver layer 3. The covering layer 4 is formed by a metal oxide such as ZnO. By way of example, the covering layer 4 has a thickness of approximately 50 nm. The covering layer 4 can prevent silver drops from forming at the silver mirror 3 at temperatures distinctly above room temperature, that is to say can prevent decrosslinking of the silver from taking place.

Figure 1C:
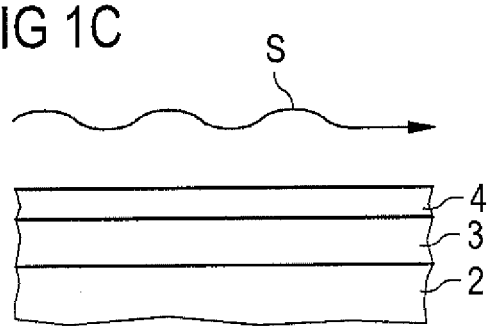

The admixing of oxygen into the silver mirror 3 is illustrated in FIG. 1C. Over a time duration of approximately 20 min and at a temperature of approximately 400° C., the silver mirror 3 with the exposed covering layer 4 is subjected to a gas flow S. The gas flow S is formed by a nitrogen-oxygen mixture. An oxygen content is approximately 0.2%, for example. An atmospheric pressure is overall approximately 1000 mbar, for example.

Alternatively, it is possible to introduce the oxygen in the silver mirror 3 with temperatures, oxygen partial pressures and time durations deviating from the values mentioned. The higher a temperature is chosen, the smaller the oxygen content and the time duration of the admixing of the oxygen should preferably be chosen.

The oxygen can be distributed uniformly or substantially uniformly in the silver mirror 3 by diffusion. It is likewise possible for oxygen to accumulate at a boundary between the silver mirror 3 and the semiconductor layer sequence 2 or for the oxygen content in the silver mirror 3 to decrease in the direction toward the semiconductor layer sequence 2.

Figure 1D:
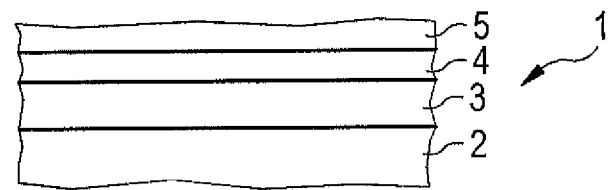

FIG. 1D illustrates that a metal layer 5 is applied to the covering layer 4. The metal layer 5 is preferably a gold layer or a platinum layer. Instead of or in addition to the metal layer 5, it is also possible to use a layer composed of a transparent conductive oxide, TCO for short.

A reflectivity of the silver mirror 3 for blue light is not or not significantly reduced by the admixing of the oxygen. In particular, the reflectivity for blue light having a wavelength of approximately 445 nm is between 93% and 96% and the reflectivity for red light having a wavelength of approximately 700 nm is between 97% and 98% inclusive.

The method steps illustrated in FIGS. 1A to 1D are preferably effected on a complete wafer on which the semiconductor layer sequence 2 is grown. Method steps such as singulating the semiconductor layer sequence 2 to form individual semiconductor chips 1 and fitting further constituent parts of the semiconductor chips 1 such as electrical contacts, passivation layers or solder layers and producing rougheings in order to improve a light coupling-out efficiency are not illustrated in the figures. By way of example, the semiconductor chip 1 is constructed as specified in the document US 2010/0171135 A1, the disclosure content of which is hereby incorporated by reference.

Figure 2:
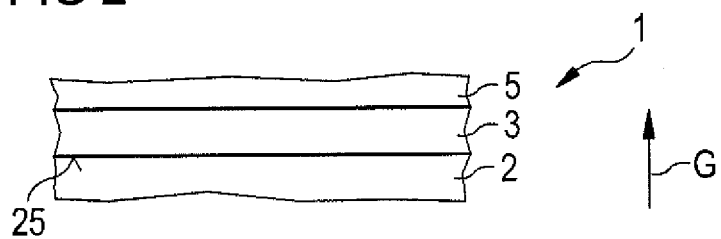
FIGS. 2 to 4 show schematic illustrations of exemplary embodiments of optoelectronic semiconductor chips in accordance with the invention.

A further exemplary embodiment of the semiconductor chip 1 is illustrated in FIG. 2. In accordance with FIG. 2, the semiconductor chip 1 is free of the covering layer 4. The metal layer 5 is applied directly on the silver mirror 3. Such a semiconductor chip 1, as shown in FIG. 2, can be produced as follows:

The silver mirror 3 composed of pure silver is applied to the semiconductor layer sequence 2. A gas flow is guided over the exposed silver mirror 3 or the silver mirror 3 is subjected to an oxygen-containing atmosphere. By way of example, the admixing of the oxygen into the silver mirror 3 is then effected at room temperature, approximately 20° C., over a time period of 24 hours and at an oxygen partial pressure of approximately 190 mbar and a total pressure of approximately 1000 mbar and under clean room conditions.

In contrast to the illustration shown in FIG. 2, it is likewise possible for a covering layer to be fitted between the silver mirror 3 and the metal layer 5. In contrast to FIG. 1, however, the covering layer is applied to the silver mirror 3 only after the admixing of the oxygen.

Figure 3:
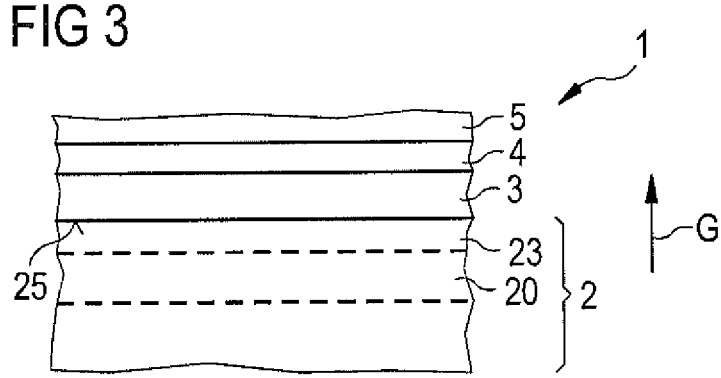

A further exemplary embodiment of the optoelectronic semiconductor chip 1 can be seen in FIG. 3. At the silver mirror 3, the semiconductor layer sequence 2 comprises a partial layer 20. The partial layer 20 is produced from p-doped GaN. The partial layer 20 has a thickness of approximately 50 nm and is doped with magnesium with a concentration of approximately $1 \times 10^{20}$ cm$^{-3}$.

Regions of the semiconductor layer sequence 2 which are adjacent to the partial layer 20 in a direction away from the silver mirror 3 are preferably likewise p-doped, in particular with magnesium. A dopant concentration of said regions below the partial layer 20, as seen along the growth direction G, is preferably at most $1 \times 10^{-20}$ cm$^{-3}$ or at most $1 \times 10^{18}$ cm$^{-3}$. Said regions can likewise be undoped if a highly doped contact layer such as, for instance, the partial layer 20 follows along the growth direction. Such a partial layer 20 can also be present in all the other exemplary embodiments.

In accordance with FIG. 3, a boundary layer 23 is situated between the silver mirror 3 and the partial layer 20. In the boundary layer 23, which has a thickness of preferably at most 0.5 nm, a material composition of the silver mirror 3 undergoes transition to a material composition of the partial layer 20. In the boundary layer 23, preferably differently than in further parts of the semiconductor layer sequence 2, an oxygen concentration similar to that in the silver mirror 3 can be present. It is possible for no distinct boundary layer 23 to be situated between the silver mirror 3 and the semiconductor layer sequence 2 or the partial layer 20.

Figure 4:
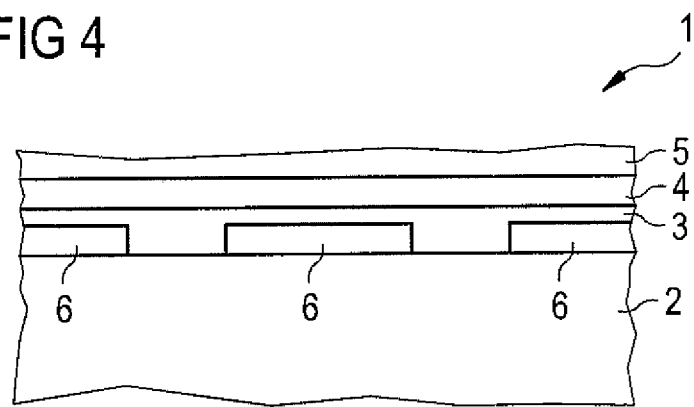

FIG. 4 illustrates a further exemplary embodiment of the semiconductor chip 1. A material 6 having a low optical refractive index is fitted in regions between the silver mirror 3 and the semiconductor layer sequence 2. Low optical refractive index means that a refractive index of the material 6 is less than a refractive index of the semiconductor layer sequence 2 by at least 0.5, for example. As a result, the material 6 can serve as a totally reflecting mirror layer. By way of example, the material 6 is formed from a silicon nitride or a silicon oxide and is electrically insulating, in particular. Electrical contact is then made with the semiconductor layer sequence 2 via a multiplicity of island-like regions in which the silver mirror 3 is in direct contact with the semiconductor layer sequence 2.

As also in all the other exemplary embodiments, the covering layer 4 is preferably electrically conductive, such that electrical contact can be made with the semiconductor layer sequence 2 through the covering layer 4. As an alternative thereto, it is possible for the covering layer 4 to be removed, for instance during the production method in accordance with FIG. 1, after the oxygen has been introduced into the silver mirror 3.

The oxygen in the silver mirror 3 reduces a contact voltage between the semiconductor layer sequence 2 and the silver mirror 3. This may be attributable to oxygen at a boundary between the silver mirror 3 and the semiconductor layer sequence 2. In comparison with a semiconductor chip that is identical apart from the oxygen in the silver mirror 3, the contact voltage falls by approximately 3%. In the case of a semiconductor chip having a size of 1 mm$^2$, the forward voltage falls by approximately 100 mV from approximately 3.1 V to approximately 3.0 V, at a current of approximately 350 mA.

The invention described here is not restricted by the description on the basis of the exemplary embodiments. Moreover, the invention encompasses any novel feature and also any combination of features, which in particular includes any combination of features in the patent claims, even if this feature or this combination itself is not explicitly specified in the patent claims or exemplary embodiments.

The invention claimed is:

1. An optoelectronic semiconductor chip comprising:
   a semiconductor layer sequence; and
   a silver mirror,
   wherein the silver mirror is arranged at the semiconductor layer sequence,
   wherein oxygen is admixed with the silver of the silver mirror with a proportion by weight of at least $10^{-5}$ and at most 10%,
   wherein a covering layer is fitted directly to a side of the silver mirror which faces away from the semiconductor layer sequence, and
   wherein the covering layer comprises a metal oxide or consists of one or more metal oxides.

2. The optoelectronic semiconductor chip according to claim 1, wherein the silver mirror is fitted directly to the semiconductor layer sequence.

3. The optoelectronic semiconductor chip according to claim 1, wherein the silver mirror comprises silver and oxygen, and wherein impurities of other substances amount to at most 100 ppm.

4. The optoelectronic semiconductor chip according to claim 1, wherein the covering layer is formed by ZnO or by doped ZnO and has a thickness of at least 20 nm and of at most 500 nm.

5. The optoelectronic semiconductor chip according to claim 1, wherein a boundary layer between the silver mirror and the semiconductor layer sequence has a thickness of at most 5 nm, and
   wherein the boundary layer comprises GaN and at least one of silver, oxygen, aluminum, indium, and magnesium.

6. The optoelectronic semiconductor chip according to claim 1, wherein a thickness of the silver mirror is between 70 nm and 300 nm inclusive.

7. The optoelectronic semiconductor chip according to claim 1, wherein the proportion by weight of the oxygen in the silver mirror is between 0.01% and 1.0% inclusive.

8. The optoelectronic semiconductor chip according to claim 1, wherein a partial layer of the semiconductor layer sequence which adjoins the silver mirror is formed from p-doped GaN or from p-doped InAlGaN.

9. The optoelectronic semiconductor chip according to claim 8, wherein the partial layer has a thickness of between 2 nm and 20 nm inclusive, a dopant is magnesium and a dopant concentration is between $1 \times 10^{19}$ cm$^{-3}$ and $2 \times 10^{20}$ cm$^{-3}$.

10. The optoelectronic semiconductor chip according to claim 8, wherein an oxygen concentration in the partial layer is at most $1 \times 10^{16}$ cm$^{-3}$.

11. A method for producing an optoelectronic semiconductor chip comprising the following steps:
    providing a semiconductor layer sequence; and
    applying a silver mirror to the semiconductor layer sequence,
    wherein oxygen is admixed with the silver of the silver mirror with a proportion by weight of at least $10^{-5}$ and at most 10%, and
    completing the semiconductor chip,
    wherein a covering layer is fitted directly to a side of the silver mirror which faces away from the semiconductor layer sequence, and
    wherein the covering layer comprises a metal oxide or consists of one or more metal oxides.

12. The method according to claim 11, wherein
    a thickness of the covering layer is between 20 nm and 500 nm inclusive,
    the covering layer is exposed during the admixing of the oxygen, during the admixing of the oxygen a temperature is between 100° C. and 550° C. inclusive, the admixing is effected under an atmosphere having an oxygen partial pressure of between 2 mbar and 200 mbar inclusive, and the admixing is effected over a time period of between 2 min and 40 min inclusive.

13. The method according to claim 11, wherein during the admixing of the oxygen the silver mirror is exposed, a temperature is between 10° C. and 80° C. inclusive, an oxygen partial pressure is between 100 mbar and 300 mbar inclusive, and a duration of the admixing is between 10 h and 36 h inclusive.

14. An optoelectronic semiconductor chip comprising:

a semiconductor layer sequence; and a silver mirror, wherein the silver mirror is arranged at the semiconductor layer sequence, wherein oxygen is admixed with the silver of the silver mirror with a proportion by weight of at least $10^{-5}$ and at most 10%, wherein a partial layer of the semiconductor layer sequence which adjoins the silver mirror is formed from p-doped GaN or from p-doped InAlGaN, and wherein the partial layer has a thickness of between 2 nm and 20 nm inclusive, a dopant is magnesium and a dopant concentration is between $1\times10^{19}$ $cm^{-3}$ and $2\times10^{20}$ $cm^{-3}$.

* * * * *